(12) United States Patent
Yuh et al.

(10) Patent No.: US 11,651,819 B2
(45) Date of Patent: May 16, 2023

(54) MEMORY CIRCUIT AND METHOD OF OPERATING THE SAME

(71) Applicant: TAIWAN SEMICONDUCTOR MANUFACTURING COMPANY, LTD., Hsinchu (TW)

(72) Inventors: Perng-Fei Yuh, Hsinchu (TW);
Shao-Ting Wu, Hisinchu (TW);
Yu-Fan Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 74 days.

(21) Appl. No.: 17/209,965

(22) Filed: Mar. 23, 2021

(65) Prior Publication Data

US 2022/0028453 A1 Jan. 27, 2022

Related U.S. Application Data

(60) Provisional application No. 63/056,046, filed on Jul. 24, 2020.

(51) Int. Cl.
*G11C 13/00* (2006.01)
*G11C 11/16* (2006.01)
*G11C 7/14* (2006.01)

(52) U.S. Cl.
CPC ........ *G11C 13/0038* (2013.01); *G11C 13/004* (2013.01); *G11C 13/0069* (2013.01);
(Continued)

(58) Field of Classification Search
CPC .............. G11C 13/0038; G11C 13/004; G11C 13/0069
(Continued)

(56) References Cited

U.S. PATENT DOCUMENTS 6,819,600 B2    11/2004   Sim
2010/0027317 A1*  2/2010   Maejima ............ G11C 13/0004
                                                        365/189.06
(Continued)

FOREIGN PATENT DOCUMENTS

KR    20100049926    5/2010
KR    20200030599    3/2020
(Continued)

OTHER PUBLICATIONS

Office Action dated Jun. 22, 2022 for corresponding case No. KR 10-2021-0054422. (pp. 1-4).
(Continued)

*Primary Examiner* — Ly D Pham
(74) *Attorney, Agent, or Firm* — Hauptman Ham, LLP

(57) ABSTRACT

A bias voltage generator includes a first current path, a first voltage clamp device, and a first buffer. The bias voltage generator receives a reference voltage and generates a first bias voltage based on a voltage difference between the reference voltage and a first drive voltage, the first voltage clamp device generates the first drive voltage based on the first bias voltage by applying the first drive voltage to the first current path, and the first buffer receives the first bias voltage and generates a second bias voltage based on the first bias voltage. A second current path includes a resistance-based memory device, and a second voltage clamp device generates a second drive voltage based on the second bias voltage and applies the second drive voltage to the second current path.

20 Claims, 8 Drawing Sheets

(52) U.S. Cl.
CPC ............ *G11C 7/14* (2013.01); *G11C 11/1655* (2013.01); *G11C 11/1673* (2013.01); *G11C 11/1697* (2013.01)

(58) Field of Classification Search
USPC ......................................................... 365/148
See application file for complete search history.

(56) References Cited

U.S. PATENT DOCUMENTS

| | | |
|---|---|---|
| 2014/0078822 A1 | 3/2014 | Umberto et al. |
| 2016/0141028 A1 | 5/2016 | Guo et al. |
| 2016/0211848 A1* | 7/2016 | Hsu ................ H03K 19/017509 |
| 2019/0164606 A1 | 5/2019 | Yu-Der et al. |
| 2019/0371397 A1 | 12/2019 | Chou et al. |
| 2021/0098037 A1* | 4/2021 | Ko .......................... G11C 5/147 |

FOREIGN PATENT DOCUMENTS

| | | |
|---|---|---|
| TW | I532052 | 5/2016 |
| TW | I559322 | 11/2016 |
| TW | I1711038 | 11/2020 |

OTHER PUBLICATIONS

Office Action dated Oct. 20, 2021 for corresponding case No. TW 11021017850. (pp. 1-4).

Notice of Allowance dated Oct. 7, 2022 for corresponding case No. KR 10-2021-005442 (pp. 1-8).

* cited by examiner

MEMORY CIRCUIT AND METHOD OF OPERATING THE SAME

PRIORITY CLAIM

The present application claims the priority of U.S. Provisional Application No. 63/056,046, filed Jul. 24, 2020, which is incorporated herein by reference in its entirety.

BACKGROUND

In some applications, integrated circuits (ICs) include memory circuits that store data in arrays of resistance-based memory devices, e.g., resistive random-access memory (RRAM) cells. A resistance-based memory device such as an RRAM cell is programmable to a high resistance state (HRS) or a low resistance state (LRS), each state representing a logical state stored by the RRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
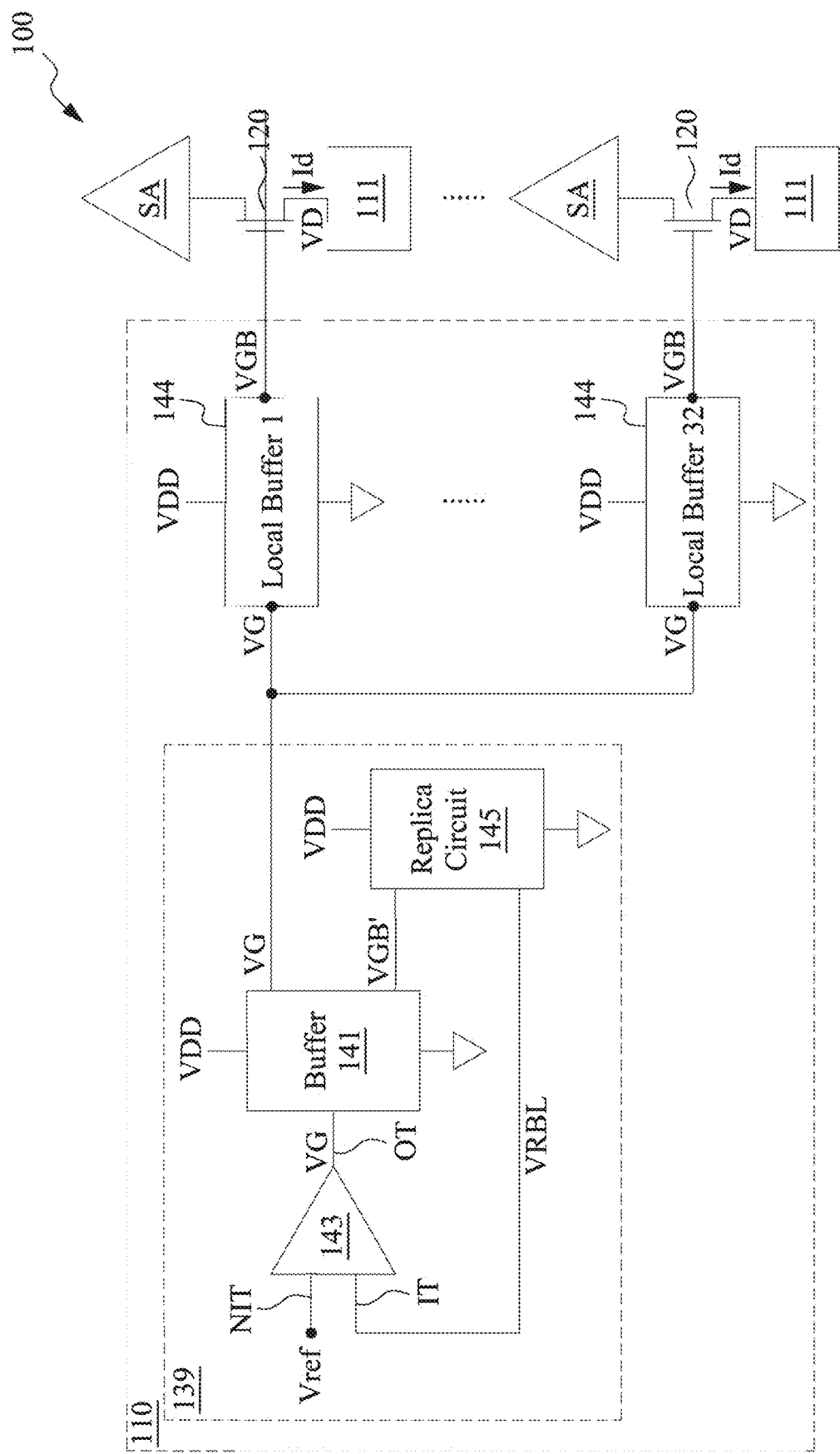
FIGS. 1A and 1B are diagrams of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a memory circuit uses a feedback configuration to generate a bias voltage whereby loading is reduced and the speed of a read operation is increased compared to other approaches. The memory circuit includes a current path with a resistance-based memory device and a replica resistive device that mimics resistance characteristics of at least a portion of the current path including the resistance-based memory device. In some embodiments, a local buffer circuit is provided to generate the bias voltage that is used by a voltage clamp device to drive a drive voltage to the current path during a read operation, and the feedback is provided by another buffer circuit configured to generate another bias voltage that is provided to the replica resistive device. In some embodiments, the bias voltage is provided using the feedback configuration including a reference current conducted through the replica resistive device to generate a reference voltage.

Compared to approaches that do not include such feedback arrangements, standby power of the bias voltage generator is decreased and the amount of charge that can be delivered dynamically is increased, thereby reducing power consumption and increasing the speed of the memory circuit.

Figure 1B:
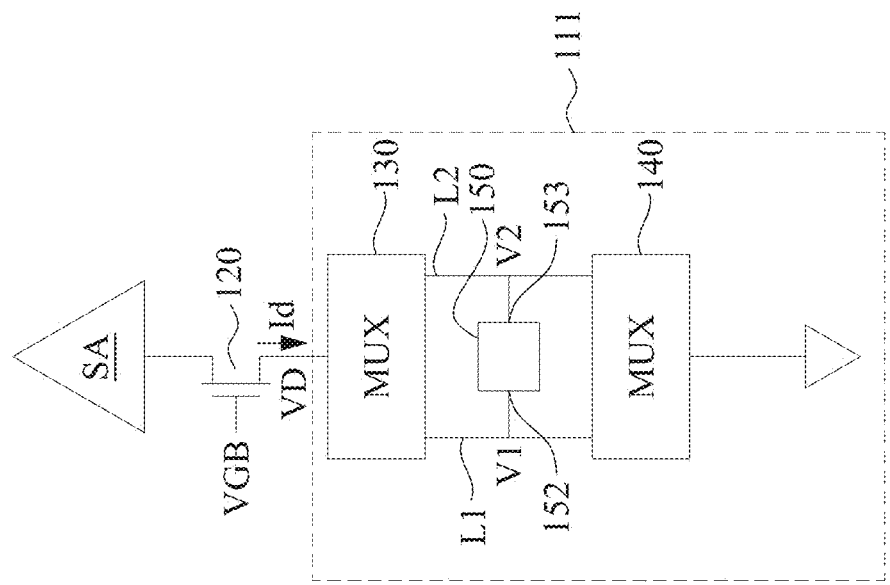

FIGS. 1A and 1B are diagrams of a memory circuit 100, in accordance with some embodiments. FIG. 1A is a top-level diagram including a bias voltage generator 110 coupled to multiple instances of a voltage clamp device 120 coupled in series between corresponding instances of a sense amplifier SA and a current path 111. FIG. 1B is a diagram of a single instance of the current path 111, sense amplifier SA, and voltage clamp device 120 coupled to the bias voltage generator 110 in the memory circuit 100.

FIG. 1A depicts details of the bias voltage generator 110 that are discussed below, and FIG. 1B depicts details of the current path 111 including an instance of a resistance-based memory device 150.

For the purpose of illustration, FIG. 1B depicts each resistance-based memory device 150 coupled between conduction lines L1 and L2. In some embodiments, memory circuit 100 is a subset of a memory macro (not shown) that includes one or more additional components, e.g., at least one control or logic circuit in addition to the array of resistance-based memory devices 150 depicted in FIGS. 1A and 1B. FIG. 1A also depicts power source voltage/nodes VDD, and each of FIGS. 1A and 1B also depicts power reference voltage/nodes, e.g., a ground, designated by ground symbols.

Each resistance-based memory device 150 is a memory storage device capable of having either a high resistance state (HRS) or a low resistance state (LRS) indicative of a logical state. In some embodiments, each resistance-based memory device 150 includes a terminal 152 coupled to its respective conduction line L1 and a terminal 153 coupled to its respective conduction line L2. Resistance-based memory device 150 includes a resistive layer (not shown) capable of having either largely insulating properties corresponding to the HRS or largely conductive properties corresponding to the LRS, e.g., based on the respective absence or presence of one or more filaments, also referred to as conduction paths. In operation, filaments are formed, e.g., thereby setting resistance-based memory devices 150 to the LRS, based on one or more various mechanisms, e.g., vacancy or defect migration or another suitable mechanism, and broken, thereby resetting resistance-based memory devices 150 to the HRS, based on heating or one or more other suitable mechanisms.

Resistance-based memory device 150 includes a selection transistor (not shown) coupled in series with the resistive layer and having a gate coupled to an input terminal (not shown), and is thereby configured to couple resistance-based memory device 150 to its respective conduction line pair L1/L2 in response to an activation voltage. In some embodiments, the resistance-based memory device 150 includes an RRAM device, a magnetic tunnel junction (MTJ) device, a phase change memory (PCM) device, and/or the like. In some embodiments of FIGS. 1A and 1B, each resistance-based memory device 150 includes an RRAM device.

In some embodiments, the resistance-based memory device 150 has a resistance value in the LRS ranging from 1 kilo-ohm (kΩ) to 4 kΩ and/or a resistance value in the HRS ranging from 15 kΩ to 30 kΩ. Other resistance values/ranges are within the scope of the present disclosure.

Resistance-based memory device 150 is thereby readable based on a memory cell voltage V12 equal to a difference between a voltage V1 at terminal 152 and a voltage V2 at terminal 153, as reduced by the level of a drain-source voltage across the selection transistor.

Memory circuit 100, or a memory macro including memory circuit 100, is configured such that memory cell voltage V12 has a read voltage level corresponding to detecting the LRS or HRS of resistance-based memory device 150 in a read operation. In order to program resistance-based memory device 150, the memory cell voltage V12 is set at a first programming voltage level to set resistance-based memory device 150 at the LRS and at a second programming voltage level to set resistance-based memory device 150 at the HRS. In some embodiments, each of the first programming voltage level and the second programming voltage level is higher in magnitude than the read voltage level.

In various embodiments, each of the first and second write operations and the read operation has a same polarity, or one of the first or second write operations or the read operation has a polarity different from that of the other two of the first or second write operations or the read operation. In each of the first and second write operations and the read operation, memory cell voltage V12 applied to resistance-based memory device 150 causes a current Id to flow between terminals 152 and 153 in a direction determined by the polarity of the memory cell voltage.

During a read operation, the memory cell voltage V12 is set at the read voltage level so that the current Id is generated. The current Id has a first current level when the resistance-based memory device 150 is in the HRS and a second current level when the resistance-based memory device 150 is in the LRS. Because a resistance level of the HRS is higher than the resistance level of the LRS, the first current level is lower than the second current level. Each sense amplifier SA is configured to detect whether the current Id has the first current level or the second current level and thus detect whether its corresponding resistance-based memory device 150 is in the HRS or in the LRS.

Each resistance-based memory device 150 is provided in a current path 111. A voltage clamp device 120 is configured to generate a drive voltage VD and apply the drive voltage VD to the current path 111 in order to generate the current Id. In FIGS. 1A and 1B, each sense amplifier SA is depicted as being coupled to a single respective resistance-based memory device 150 and a single pair of conduction lines L1, L2. This configuration is a non-limiting example provided to simplify the explanation. In some embodiments, each sense amplifier SA and each voltage clamp device 120 is coupled to a set of resistance-based memory devices 150, wherein each resistance-based memory device 150 in the set is coupled to a different pair of conduction lines.

Two or more circuit elements are considered to be coupled based on one or more direct electrical connections and/or one or more indirect electrical connections that include one or more logic devices, e.g., an inverter or logic gate, between the two or more circuit elements. In some embodiments, electrical communications between the two or more coupled circuit elements are capable of being modified, e.g., inverted or made conditional, by the one or more logic devices.

As shown in FIG. 1B, each current path 111 is coupled between a corresponding voltage clamp device 120 and power reference node. A voltage clamp device, e.g., voltage clamp device 120, is a switching device, e.g., an NMOS device, configured to limit a voltage at a conduction path terminal, e.g. a source terminal, based on a voltage received at a control terminal, e.g., a gate terminal.

Current path 111 includes path segments 130 and 140, conduction lines L1 and L2 coupled between path segments 130 and 140, and resistance-based memory device 150 coupled between conduction lines L1 and L2. In some embodiments, path segment 130 is a multiplexer that is configured to select conduction line L1. In this case, path segment 140 is a multiplexer that is configured to select conduction line L2. In other embodiments, path segment 130 is a multiplexer that is configured to select conduction line L2. In this case, path segment 140 is a multiplexer that is configured to select conduction line L1.

In operation, when multiple resistance-based memory devices 150 (coupled between their individual pairs of conduction lines) are coupled to each of the sense amplifiers SA and each of the voltage clamp devices 120, the path segments 130, 140 are used to select among the various resistance-based memory devices 150 (by selecting among the pairs of conduction lines). When a resistance-based memory device 150 is selected by the path segments 130, 140, the current Id flows through the resistance-based memory device 150 (and thus through the corresponding individual pair of conduction lines) but does not flow to the other resistance-based memory devices 150 (and the other corresponding pairs of conduction lines) that are also coupled to the individual sense amplifier SA and voltage clamp device 120.

In order for the sense amplifier SA to detect whether the selected resistance-based memory device 150 is in the HRS or the LRS in a read operation, the drive voltage VD applied to the current path 111 is maintained at the appropriate drive voltage level. However, changes in the operation of the voltage clamp device 120 due to temperature variations can result in variations in the drive voltage level.

To control the drive voltage level of the drive voltages VD generated by the voltage clamp devices 120, the memory circuit 100 includes the bias voltage generator 110 coupled to each voltage clamp device 120. The bias voltage generator 110 is configured to generate and control a bias voltage VGB for each voltage clamp device 120. More specifically, the bias voltage generator 110 is configured to maintain the drive voltage level of the drive voltages VD generated by each of the voltage clamp devices 120 near constant voltage regardless of a resistance, e.g., based on a resistive state, coupled between the voltage clamp device 120 and the power reference node. The bias voltage generator 110 is configured to adjust the voltage level of the bias voltage VGB to maintain the drive voltage VD at the drive voltage level required in order for the sense amplifier SA to detect whether the respective resistance-based memory device 150 is in the LRS or the HRS.

The bias voltage generator 110 includes a global control circuit 139 and local buffers 144. In the embodiment depicted in FIG. 1A, the bias voltage generator 110 includes thirty-two local buffers 144, one for each of the voltage clamp devices 120. In other embodiments, the bias voltage generator 110 includes more than thirty-two or fewer than thirty-two local buffers 144. Each of the local buffers 144 is configured to generate the bias voltage VGB, which is received at a corresponding one of the voltage clamp devices 120. In some embodiments, the local buffers 144 are not loaded by the components of the buffer 141, which includes components to mimic the resistive behavior of the voltage clamp devices 120 and current paths 111 with the resistance-based memory devices 150. By providing the local buffers 144, the size of the bias voltage generator 110 can be reduced and thereby save power and area.

In FIGS. 1A and 1B, each of the voltage clamp devices 120 includes an NMOS device. A gate of the NMOS device is configured to receive the bias voltage VGB from a respective one of the local buffers 144 to which it is coupled. A drain of the NMOS device is coupled to a respective one of the sense amplifiers (SA) while a source of the NMOS device is coupled to the current path 111. The NMOS device is configured to generate the current Id from the current path.

In FIG. 1A, the global control circuit 139 is configured to generate a bias voltage VG. In operation, the bias voltage VG is received by each of the local buffers 144, and each of the local buffers 144 is configured to adjust the bias voltage VGB based on the bias voltage VG. As discussed below, the global control circuit 139 is configured to adjust the bias voltage level of the bias voltage VG in order to adjust the bias voltage level of the bias voltage VGB and maintain the drive voltage level of the drive voltage VD as required by the sense amplifier SA. By separating the global control circuit 139 from the local buffers 144, the global control circuit 139 is not loaded by the voltage clamp devices 120 and the current paths 111 and is thereby capable of consuming less power and taking up a smaller area compared to approaches in which a control circuit is loaded by voltage clamp device circuits.

The global control circuit 139 includes an operational amplifier 143, a buffer 141, and a replica circuit 145. The replica circuit 145 is configured to mimic a resistance of at least a portion of the current path 111 having resistance-based memory device 150. The replica circuit 145 is configured to provide a path resistance having a predetermined resistance value based on the resistance of the current path 111. In other words, the replica circuit 145 is configured to mimic the resistive behavior of the first current path 111 as the operating conditions (e.g., temperature, physical, voltage conditions) of the first current path 111 vary. In various embodiments, the replica circuit 145 includes a polycrystalline silicon material (poly), a compound material including silicon, a semiconductor material or compound, or other material suitable to mimic the resistive behavior of the first current path 111. In some embodiments, the predetermined resistance value is based on a resistance value of a resistance-based memory device, e.g., resistance-based memory device 150 or at least some portion of the current path 111 including resistance-based memory device 150.

In various embodiments, the predetermined resistance value corresponds to the resistance value of the resistance-based memory device in the HRS or the LRS, a resistance value above the resistance value of the resistance-based memory device in the HRS, a resistance value below the resistance value of the resistance-based memory device in the LRS, or a resistance value between the resistance values of the resistance-based memory device in the HRS and the LRS. In some embodiments, the replica circuit 145 is configured to mimic the resistive behavior of the voltage clamp device 120 and the entire current path 111.

In various embodiments, the replica circuit 145 is configured to have the predetermined resistance value equal to the resistance-based memory device resistance value or to another value derived from the resistance-based memory device resistance value, e.g., a multiple or fraction of the resistance-based memory device resistance value.

The replica circuit 145 does not receive the bias voltage VGB that is received by the voltage clamp device 120. Instead, the buffer 141 is configured to generate a bias voltage VGB' and the replica circuit 145 is configured to receive the bias voltage VGB' from the buffer 141. The buffer 141 is configured to receive the bias voltage VG from the operational amplifier 143 and adjust the bias voltage VGB' based on the bias voltage VG.

In operation, the operational amplifier 143 and replica circuit 145 are used to imitate the resistive behavior of the current path 111 and ensure that the drive voltage VD is maintained at the appropriate drive voltage level. The operational amplifier 143 is configured to generate the bias voltage VG and adjust the bias voltage VG based on feedback from the replica circuit 145. More specifically, the replica circuit 145 is configured to generate a drive voltage VRBL. The replica circuit 145 is configured to adjust the drive voltage VRBL based on the bias voltage VGB'. In operation, because the replica circuit 145 mimics the resistive behavior of the current path 111, the drive voltage level of the drive voltage VRBL mimics the drive voltage level of the drive voltage VD.

The bias voltage generator 110 is configured to adjust the bias voltage VG based on a voltage difference between a reference voltage Vref and the drive voltage VRBL. In FIG. 1A, the operational amplifier 143 has a non-inverting input terminal NIT configured to receive the reference voltage Vref, an inverting terminal IT configured to receive the drive voltage VRBL, and an output terminal OT configured to output the bias voltage VG. The reference voltage Vref is set to a nearly constant reference voltage level. The reference voltage Vref has a predetermined reference voltage level configured to, in operation, cause the operational amplifier 143 to adjust the bias voltage VG such that the drive voltage levels of the drive voltages VD maintain the current levels of the currents Id at an appropriate reading level magnitude despite variations in the resistive behavior of the current paths 111 due to operational and environmental variations.

Figure 2:
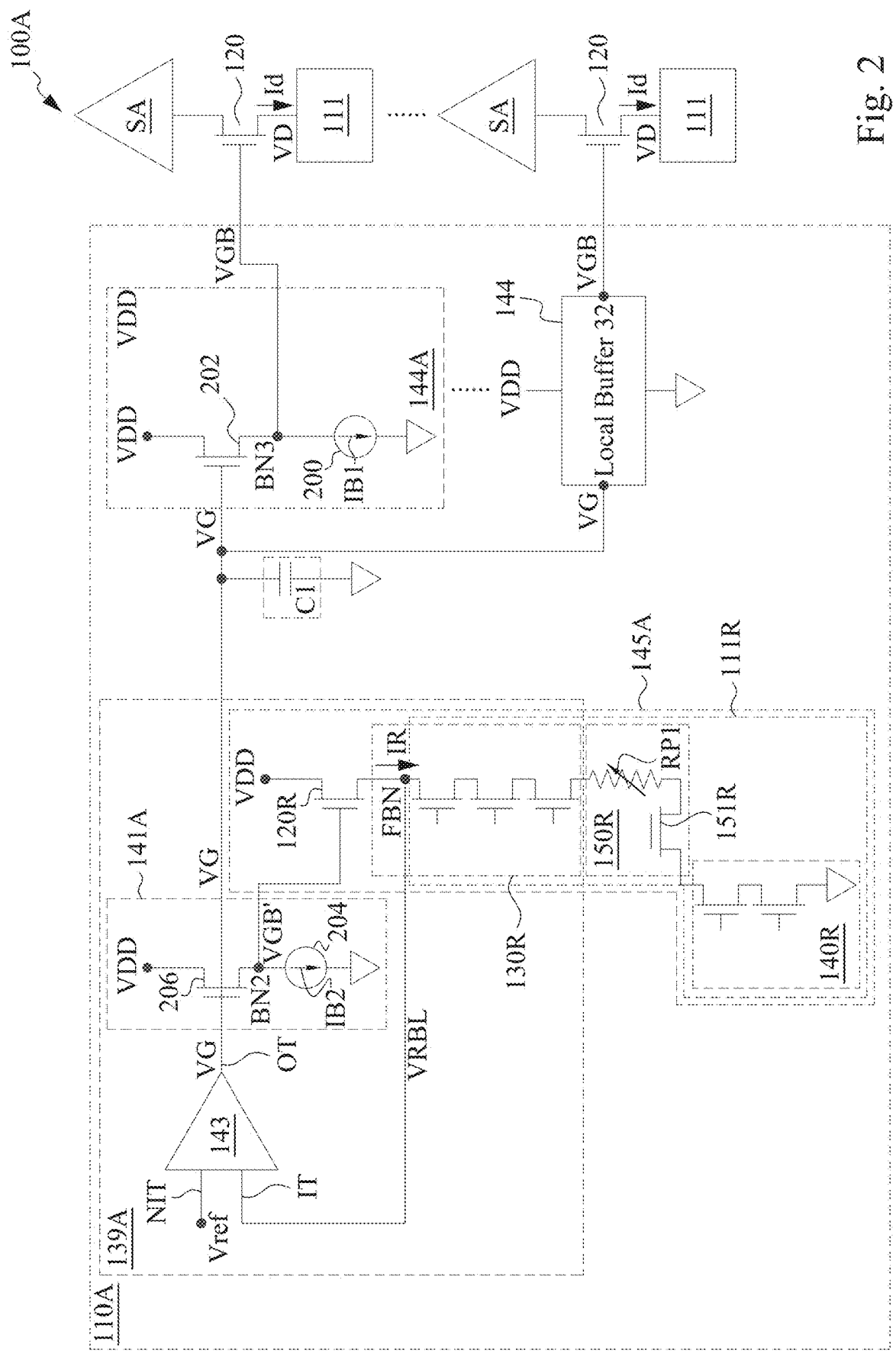
FIG. 2 is a diagram of a memory circuit, in accordance with some embodiments.

FIG. 2 is a diagram of a memory circuit 100A, in accordance with some embodiments.

Memory circuit 100A is one embodiment of the memory circuit 100. Components in memory circuit 100A that the same as the components in memory circuit 100 are labeled with the same component numbers in FIG. 2 as in FIGS. 1A and 1B and are not described again for the sake of brevity.

The memory circuit 100A includes a bias voltage generator 110A that includes a global control circuit 139A and a local buffer 144A. In this embodiment, a single buffer is shown as the local buffer 144A. In some embodiments, all of the local buffers 144 are identical to local buffer 144A. In some embodiments, the other local buffers 144 have a different configuration than the local buffer 144A, such as the configurations discussed below with respect to FIGS. 4 and 5. In some embodiments, one or more of the other local buffers 144 are provided in the same manner as local buffer 144A while one or more other of the other local buffers 144 are provided in a different configuration.

The bias voltage generator 110A includes a global control circuit 139A, which is one embodiment of the global control circuit 139 shown in FIG. 1A. The global control circuit 139A includes the operational amplifier 143 described above along with a buffer 141A and a replica circuit 145A. The buffer 141A is an embodiment of the buffer 141, described above with respect to FIG. 1A and the replica circuit 145A is an embodiment of the replica circuit 145, also described above with respect to FIG. 1A.

In the embodiment depicted in FIG. 2, the bias voltage generator 110A includes a capacitive device C1 coupled between the output terminal OT of the operational amplifier 143 and the power reference node. In some embodiments, a capacitive device, e.g., the capacitive device C1, includes a capacitor or an NMOS or PMOS device configured as a capacitor. In operation, the capacitive device C1 acts to stabilize the bias voltage VG, e.g., by decoupling noise from the local buffer 144 and/or 144A. In some embodiments, the bias voltage generator 110A does includes the capacitive device C1.

The local buffer 144A includes a current source 200 and an NMOS device 202 coupled to the current source 200 in a source follower configuration. In this embodiment, a drain of the NMOS device 202 is configured to receive power source voltage VDD, a gate of the NMOS device 202 is configured to receive the bias voltage VG from the output terminal OT of the operational amplifier 143, and the source of the NMOS device 202 is coupled to a node BN1. The node BN1 is coupled to the gate of the voltage clamp device 120 and to an anode of the current source 200. A cathode of the current source 200 is coupled to the power reference node. As such, the NMOS device 202 is configured to operate in the triode region. The current source 200 is configured to generate a current IB1. The NMOS device 202 is configured to generate the bias voltage VGB at node BN1 from the source of the NMOS device 202. Accordingly, the NMOS device 202 is configured to, in operation, conduct the current IB1 of the current source 200 and thereby adjust the bias voltage level of the bias voltage VGB such that the conducted current matches current IB1 generated by the current source 200. The NMOS device 202 is thereby configured to adjust the bias voltage level of the bias voltage VGB in accordance with a change in the bias voltage level of the bias voltage VG in order to ensure that the current IB1 is conducted as generated by the current source 200. An advantage of the local buffer 144A is that the NMOS device 202 draws very little current at the gate and presents a low impedance to the voltage clamp device 120.

The current source 200 is configured to operate in an active state and in a standby state. In the active state, the local buffer 144A is actively operating to perform the read operation. In the standby state, the local buffer 144A is on but is not actively operating to perform a read operation. Thus, the current source 200 is configured to generate the current IB1 having a first current level in the active state and a second current level in the standby state, the first current level being of a higher magnitude than the second current level.

In some embodiments, the current source 200 is configured to generate the current IB1 having the first current level ranging from 100 microamperes ($\mu A$) to 10 milliamperes (mA). In some embodiments, the current source 200 is configured to generate the current IB1 having the first current level ranging from 900 $\mu A$ to 1.1 mA, e.g., at or near 1 mA. Other first current levels/ranges are within the scope of the present disclosure.

In some embodiments, the current source 200 is configured to generate the current IB1 having the second current level ranging from 1 $\mu A$ to 100 $\mu A$. In some embodiments, the current source 200 is configured to generate the current IB1 having the second current level ranging from 8 $\mu A$ to 12 $\mu A$, e.g., at or near 10 $\mu A$. Other second current levels/ranges are within the scope of the present disclosure.

The buffer 141A includes a current source 204 and an NMOS device 206 coupled to the current source 204 in a source follower configuration. In this embodiment, a drain of the NMOS device 206 is configured to receive power source voltage VDD, a gate of the NMOS device 206 is configured to receive the bias voltage VG from the output terminal OT of the operational amplifier 143, and a source of the NMOS device 206 is coupled to a node BN2. The node BN2 is coupled to a gate of a voltage clamp device 120R in the replica circuit 145A and to an anode of the current source 204. A cathode of the current source 204 is coupled to the power reference node. As such, the NMOS device 206 is configured to operate in the triode region. The current source 204 is configured to generate a current IB2. The NMOS device 206 is configured to generate the bias voltage VGB' at node BN2 from the source of the NMOS device 206. Accordingly, the NMOS device 206 is configured to, in operation, conduct the current IB2 of the current source 204 and thereby adjust the bias voltage level of the bias voltage VGB' such that the conducted current matches current IB2 generated by the current source 204. The NMOS device 206 is thereby configured to adjust the bias voltage level of the bias voltage VGB' in accordance with a change in the bias voltage level of the bias voltage VG in order to ensure that the current IB2 is conducted as generated by the current source 204. An advantage of the buffer 141A is that the NMOS device 206 draws very little current at the gate and presents a low impedance to the voltage clamp device 120R.

In this embodiment, the current level of the current IB2 is approximately equal to the second current level of the current IB1 when the current source 200 is in the standby mode. In operation, the local buffer 141A also maintains the feedback to generate the bias voltage VGB by the local buffer 144A during the standby state, thereby significantly reducing the amount of power consumed by the memory circuit 100A during the standby state compared to other approaches. Furthermore, the local buffer 144A is capable of delivering a dynamic change in charge to the gate of its respective voltage clamp device 120 and thereby stabilize the bias voltage VGB during a disturbance or a transition.

The replica circuit 145A is configured to mimic the resistive behavior of the voltage clamp device 120 and the current path 111. The replica circuit 145A includes the voltage clamp device 120R, a replica path segment 130R, a replica resistance-based memory device 150R, and a replica path segment 140R. The voltage clamp device 120R is configured to mimic the operation of the voltage clamp device 120, the replica path segment 130R is configured to mimic the resistive behavior of the path segment 130, the replica resistance-based memory device 150R is configured to mimic the resistive behavior of the resistance-based memory device 150, and the replica path segment 140R is configured to mimic the resistive behavior of the path segment 140. The replica path segment 130R, the replica resistance-based memory device 150R, and the replica path segment 140R make up a replica current path 111R. The replica current path 111R is thereby configured to mimic the resistive behavior of the current path 111.

In this embodiment, the voltage clamp device 120R is an NMOS device having a drain configured to receive the power supply voltage VDD, a gate configured to receive the bias voltage VGB' from the node BN2 and a source that is coupled to a feedback node FBN. The voltage clamp device 120R is configured to generate the drive voltage VRBL from the source such that, in operation, the drive voltage VRBL is applied to the replica current path 111R at the feedback node FBN, thereby generating a replica current IR that propagates through the replica current path 111R. The replica path segment 130R includes three FETs coupled in series to mimic the resistance of one of the path segments 130, which in some embodiments are multiplexers. The replica path segment 140R includes two FETs coupled in series to mimic the resistance of one of the path segments 140, which in some embodiments are multiplexers.

The replica resistance-based memory device 150R includes a replica selection transistor 151R and a replica resistive device RP1. The replica selection transistor 151R is configured to mimic the resistive behavior of the selection transistor in the resistance-based memory device 150. In some embodiments, transistor 151R has dimensions that match those of the selection transistor of resistance-based memory device 150 such that, for a given transistor bias defined by the current level of replica current IR and the output voltage of amplifier 143, transistor 151R has a voltage drop equal to a value of the drain-source voltage of the selection transistor in the resistance-based memory device 150 having the same transistor bias. In various embodiments, transistor 151R has dimensions related to those of the selection transistor such that, for the given transistor bias, transistor 151 generates voltage drop having a value derived from the drain-source voltage value, e.g., a multiple or fraction of the drain-source voltage value.

Resistive device RP1 is one or more conductive segments configured to provide a path resistance. The one or more conductive segments have dimensions configured to provide the path resistance having a predetermined resistance value. In various embodiments, the one or more conductive segments include a polycrystalline silicon material (poly), a compound material including silicon, a semiconductor material or compound, or other material suitable for having the predetermined resistance value. In some embodiments, the predetermined resistance value is based on a resistance value of a resistance-based memory device, e.g., resistance-based memory device 150.

In various embodiments, the predetermined resistance value corresponds to the resistance value of the resistance-based memory device 150 in the HRS or the LRS. In some embodiments, a resistance value is above the resistance value of the resistance-based memory device 150 in the HRS, a resistance value is below the resistance value of the resistance-based memory device 150 in the LRS, or a resistance value is between the resistance values of the resistance-based memory device 150 in the HRS and the LRS.

In various embodiments, resistive device RP1 is configured to have the predetermined resistance value equal to the resistance-based memory device 150 resistance value or to another value derived from the resistance-based memory device 150 resistance value, e.g., a multiple or fraction of the resistance-based memory device 150 resistance value. In some embodiments, in addition to the resistance value of the resistance-based memory device 150, the predetermined resistance value of the resistive device RP1 includes the resistance value of the appropriate portions of one pair of the conduction lines L1, L2. Thus, in these embodiments, the predetermined resistance value is set in accordance with a resistive value of the resistance-based memory device 150 plus the resistance value of the appropriate portions of one pair of the conduction lines L1, L2.

In some embodiments, resistive device RP1 is configured to have the predetermined resistance value ranging from 1 kΩ to 50 kΩ. In some embodiments, resistive device RP1 is configured to have the predetermined resistance value ranging from 2 kΩ to 5 kΩ. Other predetermined resistance values/ranges are within the scope of the present disclosure.

In operation, the drive voltage level of the drive voltage VRBL is thereby applied to the replica current path 111R that mimics the resistive behavior of one of the current paths 111 including an instance of the resistance-based memory device 150. The drive voltage VRBL is fed back to the inverting terminal IT of the operational amplifier 143, and the operational amplifier 143 is configured to adjust the bias voltage level of the bias voltage VG until the drive voltage level of the drive voltage VRBL and the reference voltage level of the reference voltage Vref are approximately equal. The bias voltage level of the bias voltage VGB' received at the gate of the replica voltage clamp device 120R is thereby adjusted by the buffer 141A. In response, the local buffer 144A is configured to provide a corresponding adjustment in the bias voltage level of the bias voltage VGB received at the gate of the voltage clamp device 120. As a result, the voltage clamp device 120 is configured to adjust the drive voltage level of the drive voltage VD in response to the corresponding adjustment in the bias voltage level of the bias voltage VGB. In this manner, the drive voltage level of the drive voltage VD is maintained at the appropriate voltage level in accordance with the reference voltage level of the reference voltage Vref.

In some embodiments, the replica circuit 145A is configured to generate replica current IR having a current level corresponding to the second current level generated by current source 200 in the standby state as discussed above. In some embodiments, the current source 204 is configured to generate the current IB2 having a current level corresponding to the second current level generated by current source 200 in the standby state. In some embodiments, the operational amplifier 143 is configured to draw a current on the same order of magnitude as the second current level generated by current source 200 in the standby state.

Memory circuit 100A is thereby configured to have a total standby current less than that of a memory circuit based on an approach that does not include the operational amplifier 143, the buffer 141A, the replica circuit 145A, and the instances of local buffers 144 and/or 144A.

In a non-limiting example, in the standby state, the operational amplifier 143 draws 40 µA, the buffer 141A draws 10 µA, the replica circuit 145A draws 10 µA, and each of 32 instances of the local buffer 144 and/or 144A draws 10 µA such that the bias voltage generator 110A of the memory circuit 100A draws a total of 380 µA in the standby state. Other current levels/ranges are within the scope of the present disclosure.

Figure 3:
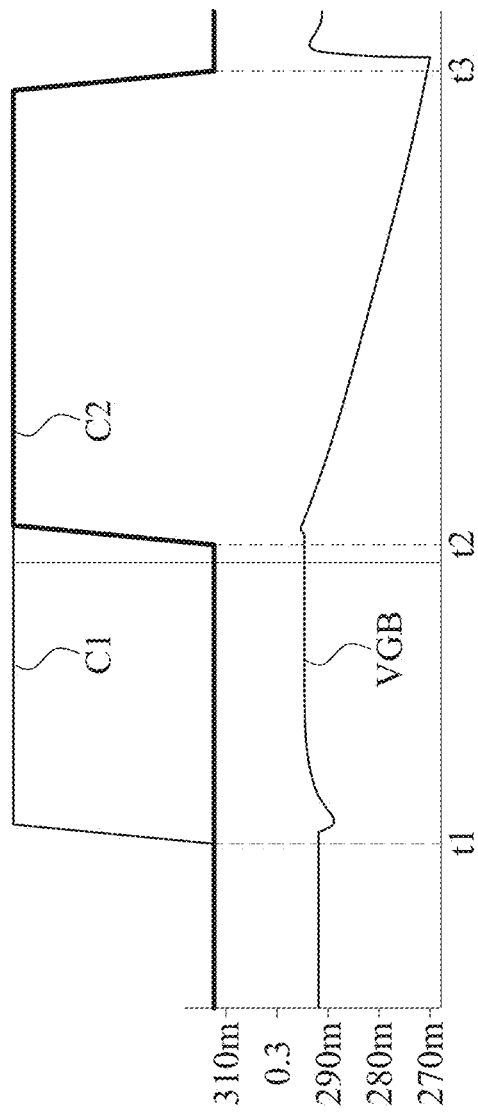
FIG. 3 is a graph that illustrates a bias voltage during a read operation, in accordance with some embodiments.

FIG. 3 is a graph that illustrates the bias voltage VGB during a read operation in accordance with some embodiments.

FIG. 3 depicts a non-limiting example in which an instance of the bias voltage VGB generated by the bias voltage generator 110A of the memory circuit 100A shown in FIG. 2 is plotted over time. A control signal C1 is configured to switch between a low voltage state to a high voltage state at a time t1 corresponding to the memory circuit 100A being switched from an off state to the standby state. At a time t2, a control signal C2 is switched from the low voltage state to the high voltage state corresponding to the memory circuit 100A being switched from the standby state to the active state, during which the memory circuit 100A performs a read operation. At a time t3, the read operation ends, the control signal C2 is switched from the high voltage state to the low voltage state, and the memory circuit 100A is switched from the active state back to the standby state.

In the non-limiting example of FIG. 3, the bias voltage VGB has an initial voltage level of approximately 300 millivolts (mV) for a period prior to time t1 through time t2. Between times t2 and t3, the bias voltage VGB exhibits a voltage drop during the read operation of approximately 30 mV followed by a return to the initial voltage level of approximately 300 mV, a performance level comparable to that of other approaches in which a bias voltage is generated without using the operational amplifier 143, the buffer 141A, the replica circuit 145A, and the instances of local buffers 144 and/or 144A. Other initial voltage levels and/or voltage drop levels are within the scope of the present disclosure.

Figure 4:
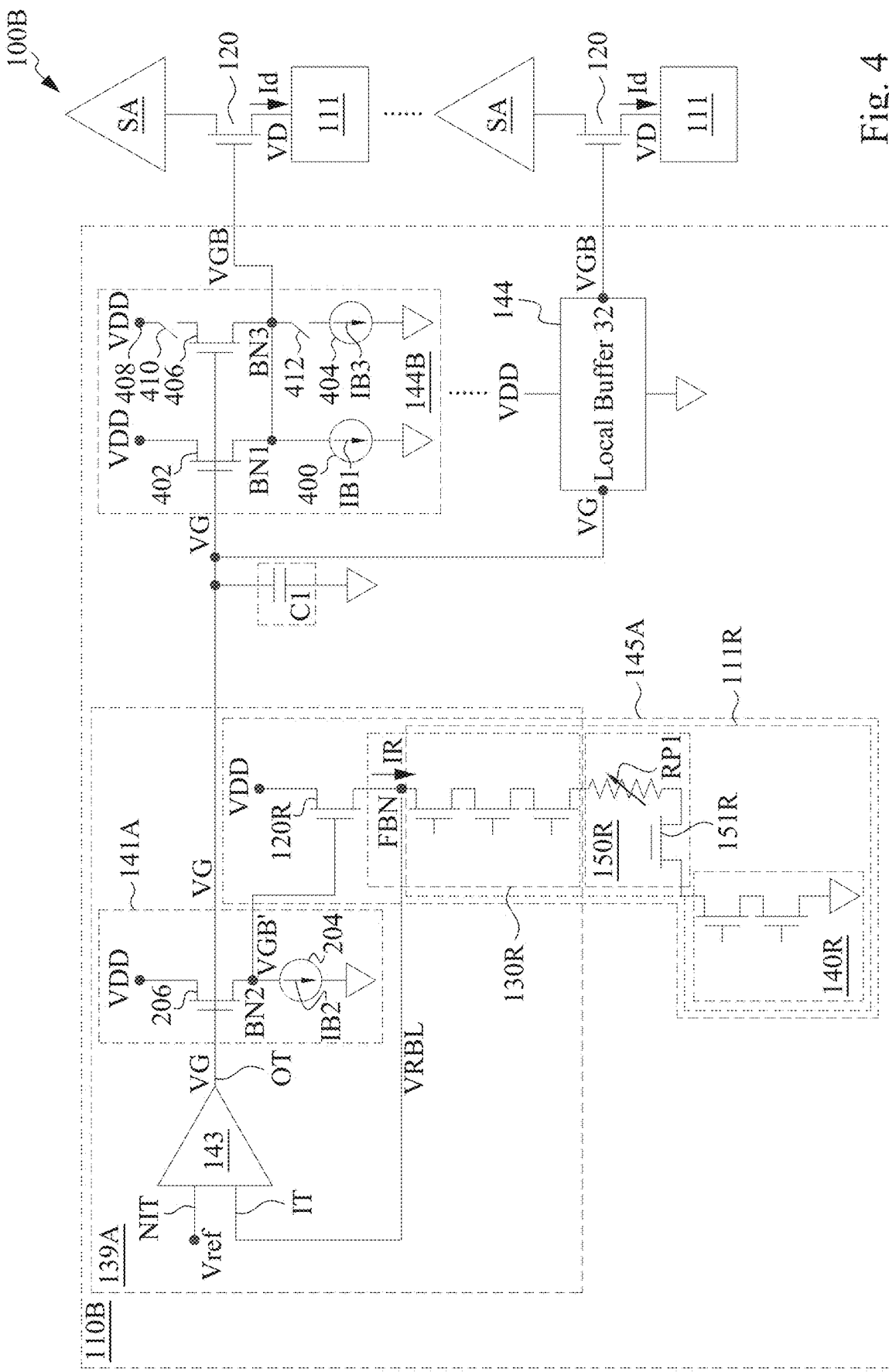
FIG. 4 is a diagram of a memory circuit, in accordance with some embodiments.

FIG. 4 is a diagram of a memory circuit 100B, in accordance with some embodiments.

Memory circuit 100B is one embodiment of the memory circuit 100. Components in memory circuit 100B that are the same as the components in memory circuit 100A and the memory circuit 100 are labeled with the same component numbers in FIG. 4 as in FIGS. 1A-2 and are not described again for the sake of brevity.

The memory circuit 100B includes a bias voltage generator 110B that includes the global control circuit 139A and a local buffer 144B. In this embodiment, only the buffer 1 is shown as the local buffer 144B. In some embodiments, all of the local buffers 144 are identical to local buffer 144B. In some embodiments, the other local buffers 144 have a different configuration than the local buffer 144B, such as the local buffer 144A discussed above and/or the configurations discussed herein with respect to FIGS. 2, 3, and 5. In some embodiments, one or more of the other local buffers 144 are provided in the same manner as local buffer 144B while one or more other of the other local buffers 144 are provided in a different configuration.

The local buffer 144B includes a current source 400 and an NMOS device 402 coupled to the current source 400 in a source follower configuration. In this embodiment, a drain of the NMOS device 402 is configured to receive the power source voltage VDD, a gate of the NMOS device 402 is configured to receive the bias voltage VG from the output terminal OT of the operational amplifier 143, and the source of the NMOS device 402 is coupled to the node BN1. The node BN1 is coupled to the gate of the voltage clamp device 120 and to an anode of the current source 400. A cathode of the current source 400 is coupled to the power reference node. As such, the NMOS device 402 is configured to operate in the triode region. The current source 400 is configured to generate the current IB1. In this embodiment, the current source 400 is configured to generate the current IB1 at the second current level both in the standby state and in the active state. Thus, unlike the current source 200 discussed above with respect to FIG. 2, the current source 400 does not operate at two different current levels depending on whether the memory circuit 100B is in the standby state or in the active state.

The local buffer 144B also includes a current source 404 and an NMOS device 406. The current source 404 and the NMOS device 406 are configured to be deactivated in the standby state and activated in the active state. The NMOS device 406 has a gate configured to receive the bias voltage VG. A node 408 is configured to receive the power supply voltage VDD. A switch 410 is coupled between the node 408 and the drain of the NMOS device 406. The switch 410 is configured to be open in the standby state and closed in the active state. Accordingly, in the active state, the NMOS device 406 receives the power supply voltage VDD at the drain of the NMOS device 406. In the standby state, the NMOS device 406 does not receive the power supply voltage VDD at the drain and thus is inactive. A source of the NMOS device is coupled to a node BN3. The node BN3 is coupled to the node BN1 and to the gate of the voltage clamp device 120. A switch 412 is coupled between the node BN3 and an anode of the current source 404. The switch 412 is configured to be open in the standby state and closed in the active state. Accordingly, the current source 404 is activated in the active state and deactivated in the standby state. When the current source 404 is activated, the current source 404 is configured to generate a current IB3 having a third current level. In some embodiments, the first current level discussed above with respect to FIG. 2 is approximately equal to the second current level plus the third current level. As such, when the local buffer 144B is in the active state during a read operation, the current source 400 and the current source 404 are configured to generate a total current having the first current level. When in the standby state, the current source 404 is inactive and thus the current IB3 is not generated, and the total current is equal to the current IB1 having the second current level.

During the standby state, the NMOS device 402 at node BN1 is configured to generate the bias voltage VGB from the source of the NMOS device 402. Accordingly, the NMOS device 402 is configured to, in operation, conduct the current IB1 of the current source 400 and thus the NMOS device 402 is configured to adjust the bias voltage level of the bias voltage VGB such that the conducted current matches the current IB1 generated by the current source 400. The NMOS device 402 is thereby configured to adjust the bias voltage level of the bias voltage VGB in accordance with a change in the bias voltage level of the bias voltage VG in order to ensure that the current IB1 is conducted as generated by the current source 400. The NMOS device 406 is inactive in the standby state and thus does not help regulate the bias voltage VG or contribute significantly to power consumption.

In the active state, the NMOS device 406 is activated. The NMOS device 402 at node BN1 and the NMOS device 406 at node BN3 are configured to collectively generate the bias voltage VGB from the source of the NMOS device 402 and the source of the NMOS device 406. Accordingly, the NMOS device 402 and the NMOS device 406 are configured to, in operation, conduct a current that is equal to a sum of the current IB1 of the current source 400 and the current IB3 of the current source 404. The NMOS device 402 and the NMOS device 406 are thereby configured to adjust the bias voltage level of the bias voltage VGB such that the conducted current matches the current IB1+IB3 generated by the respective current sources 400 and 404. The NMOS devices 402 and 406 are thereby configured to adjust the bias voltage level of the bias voltage VGB in accordance with a change in the bias voltage level of the bias voltage VG in order to ensure that the current IB1+IB3 is conducted as generated by the current source 400 and the current source 404. The local buffer 144B including the NMOS device 402 and the NMOS device 406 is thereby configured to provide a dynamic current that delivers a charge that can quickly handle adjustments to the bias voltage VGB in the active state and operates at low current and power levels in the standby state.

Figure 5:
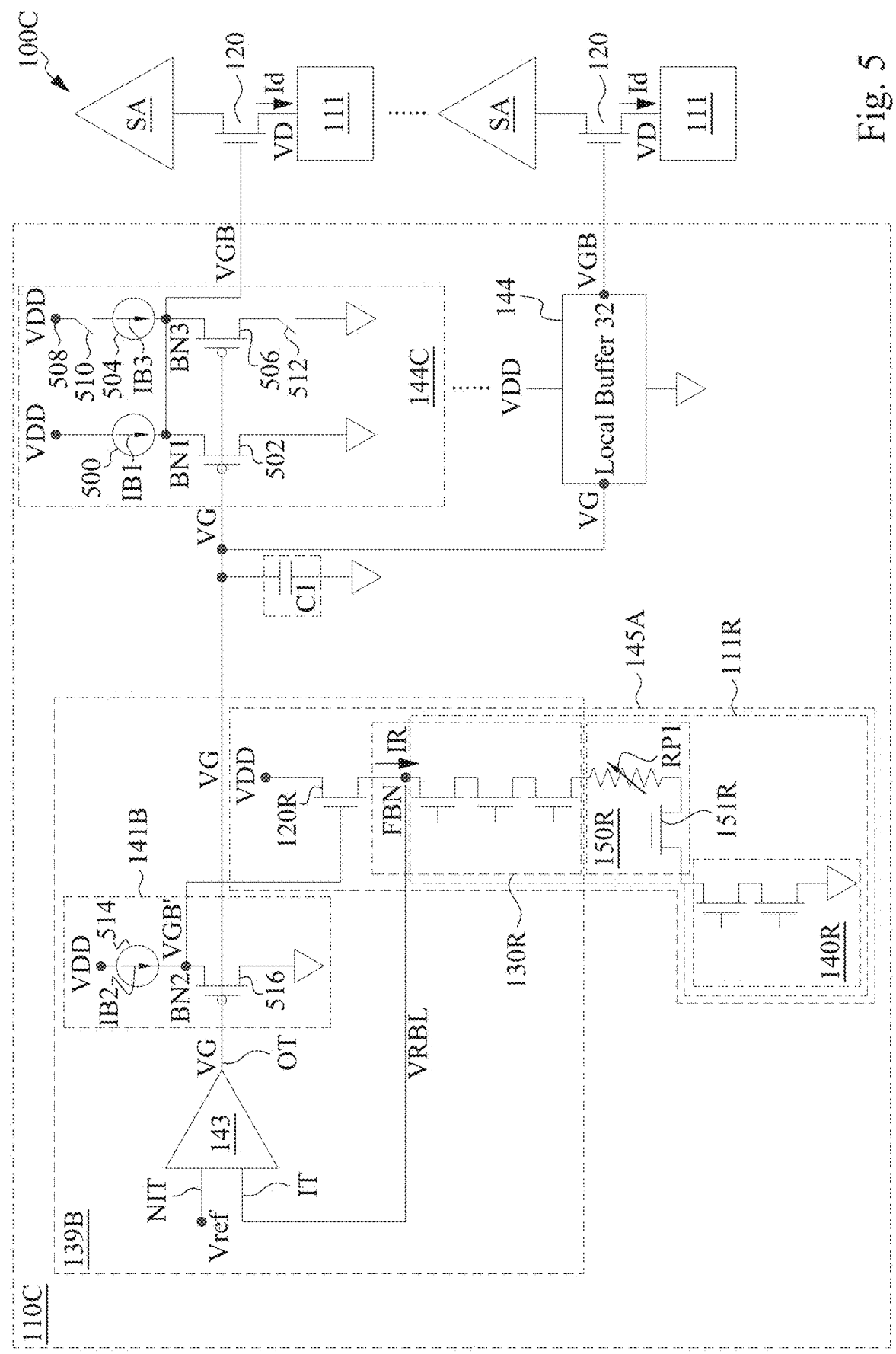
FIG. 5 is a diagram of a memory circuit, in accordance with some embodiments.

FIG. 5 is a diagram of a memory circuit 100C, in accordance with some embodiments.

Memory circuit 100C is one embodiment of the memory circuit 100. Components in memory circuit 100C that are the same as the components in memory circuit 100 are labeled with the same component numbers in FIG. 5 as in FIGS. 1A and 1B and are not described again for the sake of brevity.

The memory circuit 100C includes a bias voltage generator 110C that includes a global control circuit 139B and a local buffer 144C. In this embodiment, only the buffer 1 is shown as the local buffer 144C. In some embodiments, all of the local buffers 144 are identical to local buffer 144C. In other embodiments, the other local buffers 144 have a different configuration than the local buffer 144C, such as the local buffer 144A above and/or the configurations explained above for FIGS. 2 and 4. In still other embodiments, one or more of the other local buffers 144 are provided in the same manner as local buffer 144C while one or more other of the other local buffers 144 are provided in a different configuration.

The local buffer 144C includes a current source 500 and a PMOS device 502 coupled to the current source 500 in a source follower configuration. In this embodiment, a drain of the PMOS device 502 is configured to receive the power reference voltage, a gate of the PMOS device 502 is configured to receive the bias voltage VG from the output terminal OT of the operational amplifier 143 and a source of the PMOS device 502 is coupled to the node BN1. The node BN1 is coupled to the gate of the voltage clamp device 120 and to a cathode of the current source 500. An anode of the current source 500 is configured to receive the power source voltage VDD. As such, the PMOS device 502 is configured to operate in the triode region. In this embodiment, the current source 500 is configured to generate the current IB1 at the second current level both in the standby state and in the active state. Thus, unlike the current source 200 in FIG. 2, the current source 500 does not operate at two different current levels depending on whether the memory circuit 100C is in the standby state or in the active state.

The local buffer 144C also includes a current source 504 and a PMOS device 506. The current source 504 and the PMOS device 506 are configured to be deactivated in the standby state and activated in the active state. The PMOS device 506 has a gate configured to receive the bias voltage VG. A drain of the PMOS device 506 is configured to receive the power reference voltage. A switch 512 is coupled between the power reference node and the drain of the PMOS device 506. The switch 512 is configured to be open in the standby state and closed in active state. Accordingly, in the active state, the PMOS device 506 receives the power reference voltage at the drain of the PMOS device 506. In the standby state, the PMOS device 506 does not receive the power reference voltage at the drain and thus is inactive. A source of the PMOS device 506 is coupled to the node BN3. The node BN3 is coupled to the node BN1 and to the gate of the voltage clamp device 120. A node 508 is configured to receive the power supply voltage VDD. A switch 510 is coupled between the node 508 and an anode of the current source 504. A cathode of the current source 504 is coupled to the node BN3. The source of the PMOS device 506 is also coupled to the node BN3. The switch 510 is configured to be open in the standby state and closed in the active state. Accordingly, the current source 504 is activated in the active state and deactivated in the standby state. When the current source 504 is activated, the current source 504 is configured to generate the current IB3 having the third current level. In some embodiments, the first current level discussed above with respect to FIG. 2 is at or is approximately equal to the second current level plus the third current level. As such, when the local buffer 144C is in the active state during a read operation, the current source 500 and the current source 504 are configured to generate a total current having the first current level. When in the standby state, the current source 504 is inactive and thus the current IB3 is not generated, and the total current is equal to the current IB1 having the second current level.

During the standby state, the PMOS device 502 at node BN1 is configured to generate the bias voltage VGB from the source of the PMOS device 502. Accordingly, the PMOS device 402 is configured to, in operation, conduct the current IB1 of the current source 500 and thus the PMOS device 502 is configured to adjust the bias voltage level of the bias voltage VGB such that the conducted current matches the current IB1 generated by the current source. Accordingly, the PMOS device 502 is configured to adjust the bias voltage level of the bias voltage VGB in accordance with a change in the bias voltage level of the bias voltage VG in order to ensure that the current IB1 is conducted as generated by the current source 500. The PMOS device 506 is inactive in the standby state and thus does not help regulate the bias voltage VG or contribute significantly to power consumption.

In the active state, the PMOS device 506 is activated. The PMOS device 502 at node BN1 and the PMOS device 506 at node BN3 are configured to collectively generate the bias voltage VGB from the source of the PMOS device 502 and the source of the PMOS device 506. Accordingly, the PMOS device 502 and the PMOS device 506 are configured to, in operation, conduct a current that is equal to a sum of the current IB1 of the current source 500 and the current IB3 of the current source 504. The PMOS device 502 and the PMOS device 506 are thereby configured to adjust the bias voltage level of the bias voltage VGB such that the conducted current matches the current IB1+IB3 generated by the respective current sources 500 and 504. The PMOS devices 502 and 506 are thereby configured to adjust the bias voltage level of the bias voltage VGB in accordance with a change in the bias voltage level of the bias voltage VG in order to ensure that the current IB1+IB3 is conducted as generated by the current source 500 and the current source 504. The local buffer 144C including the PMOS device 502 and the PMOS device 506 is thereby configured to provide a dynamic current that delivers a charge that can quickly handle adjustments to the bias voltage VGB in the active state and operates at low current and power levels in the standby state.

The global control circuit 139B is one embodiment of the global control circuit 139 shown in FIG. 1A. The global control circuit 139B includes the operational amplifier 143 and the replica circuit 145A discussed above with respect to FIGS. 1A and 2, and also includes a buffer 141B.

The buffer 141B includes a current source 514 and a PMOS device 516 coupled to the current source 514 in a source follower configuration. In this embodiment, a drain of the PMOS device 516 is coupled to the power reference node, a gate of the PMOS device 516 is configured to receive the bias voltage VG from the output terminal OT of the operational amplifier 143, and a source of the PMOS device 516 is coupled to a node BN2. The node BN2 is coupled to the gate of the voltage clamp device 120R in the replica circuit 145A and to a cathode of the current source 514. An anode of the current source 514 is configured to receive the power source voltage VDD. As such, the PMOS device 516 is configured to operate in the triode region. The current source 514 is configured to generate the current IB2. The PMOS device 516 at node BN2 is configured to generate the bias voltage VGB' from the source of the PMOS device 516. Accordingly, the PMOS device 516 is configured to, in operation, conduct the current IB2 of the current source 514 and thereby adjust the bias voltage level of the bias voltage VGB' such that the conducted current matches the current IB2 generated by the current source 514. The PMOS device 516 is thereby configured to adjust the bias voltage level of the bias voltage VGB' in accordance with a change in the bias voltage level of the bias voltage VG in order to ensure that the current IB2 is conducted as generated by the current source 514. An advantage of the buffer 141B is that the PMOS device 516 draws very little current at the gate and presents a low impedance to the voltage clamp device 120R. The buffer 141B also maintains the feedback to generate the bias voltage VGB by the local buffer 144C during the standby state, thereby significantly reducing the amount of power consumed by the memory circuit 100C during the standby state compared to other approaches.

Figure 6:
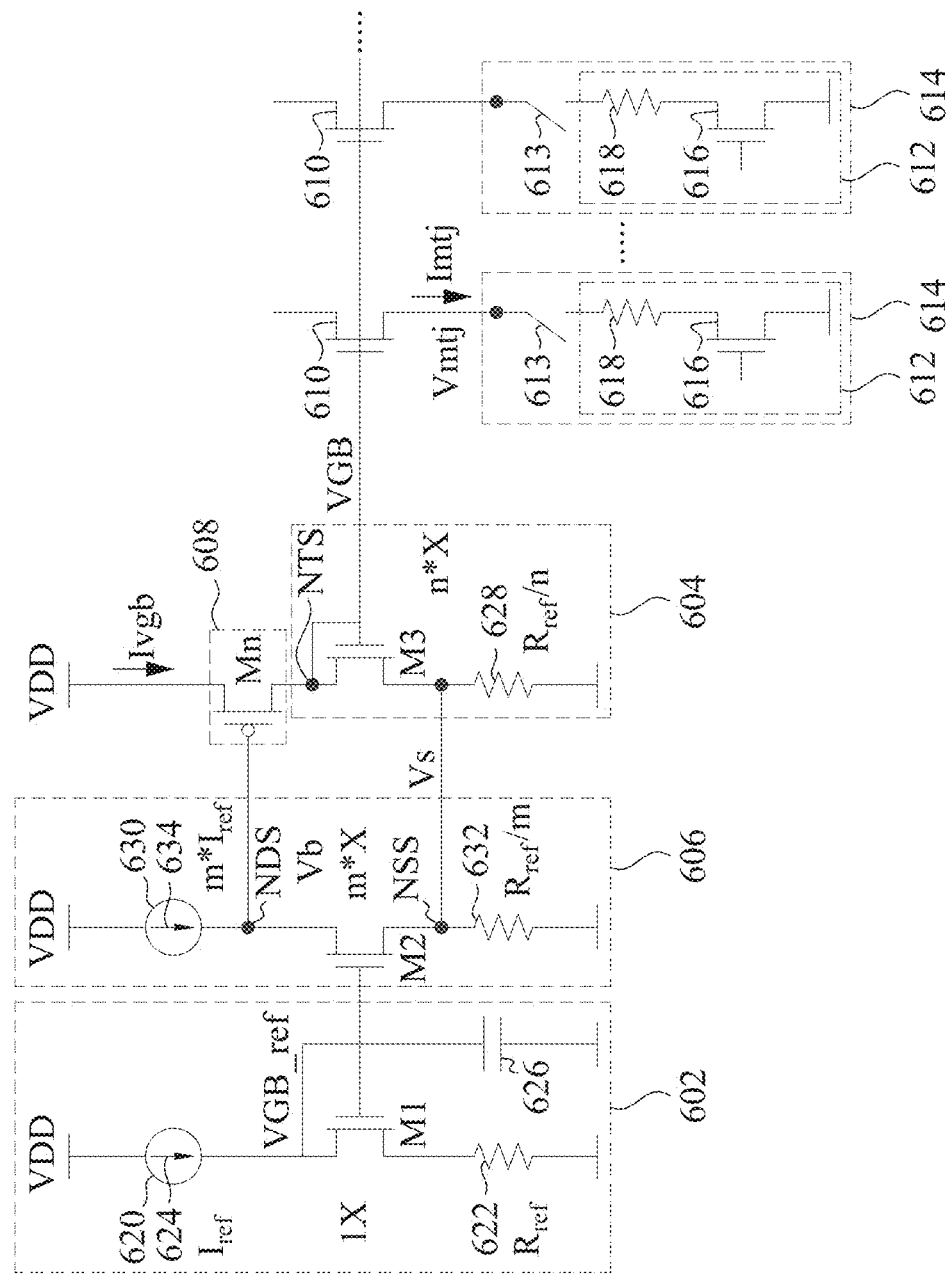
FIG. 6 is a diagram of a memory circuit, in accordance with some embodiments.

FIG. 6 is a diagram of a memory circuit 600, in accordance with some embodiments.

The memory circuit 600 includes a reference stage 602, a voltage sensing stage 604, a gain stage 606, a buffer 608, voltage clamp devices 610, and current paths 612. As discussed below, the reference stage 602, voltage sensing stage 604, gain stage 606, and buffer 608 collectively correspond to a bias voltage generator configured to generate the bias voltage VGB discussed above with respect to FIGS. 1A-5.

Each of the current paths 612 includes a multiplexing switch 613 and a resistance-based memory device 614. The multiplexing switch 613 is coupled in series between a corresponding one of the voltage clamp devices 610 and the resistance-based memory device 614. Each of the multiplexing switches 613 is configured to be closed when the corresponding current path 612 is selected and open when the corresponding current path 612 is not selected. Each of the resistance-based memory devices 614 includes a selection transistor 616 coupled in series with a variable resistance device 618 and having a gate coupled to an input terminal (not shown), and is thereby configured to couple the resistance-based memory device 614 to a corresponding conduction line (not labeled) in response to an activation voltage. In some embodiments, each of variable resistance devices 618 includes an RRAM device, an MTJ device, a PCM device, or the like.

In this embodiment, each of the voltage clamp devices 610 is an NMOS device having a drain coupled to a sense amplifier (not shown), a source coupled to a corresponding one of the current paths 612, and a gate coupled to a node NTS configured to have the bias voltage VGB. In operation, when a given selection transistor 616 is on and the selection transistor 616 is closed, the bias voltage VGB causes the voltage clamp device 610 to apply a drive voltage Vmtj to the corresponding current path 612, thereby generating a read current Imtj.

The reference stage 602 is configured to generate a reference voltage VGB_ref. In this embodiment, the reference stage 602 includes a current source 620, an NMOS device M1, a resistive device 622, and a capacitive device 626. The current source 620 is configured to receive the power source voltage VDD at an anode of the current source 620, and a cathode of the current source 620 is coupled to a drain of the NMOS device M1. The current source 620 is configured to generate a current 624 having a current level Iref. The drain of the NMOS device M1 is coupled to a gate of the NMOS device M1. The resistive device 622 is coupled between a source of the NMOS device M1 and the power reference node. The capacitive device 626 is coupled between the gate of the NMOS device M1 and the power reference node. The resistive device 622 has a resistance of Rref configured to replicate a resistance of the current paths 612 in the manner discussed above with respect to replica resistive device RP1 and FIG. 2. The NMOS device M1 has a channel size 1× such that a voltage Vgs (not labeled) of the NMOS device M1 is a function of the channel size 1× and the current level Iref.

The reference stage 602 is thereby configured to, in operation, generate the reference voltage VGB_ref having a voltage level equal to the voltage Vgs of the NMOS device M1 plus a voltage across the resistive device 622, each generated based on the current level Iref. In some embodiments, the current level Iref corresponds to a predetermined activation current of the variable resistance devices 618.

The voltage sensing stage 604 is configured to generate a voltage Vs on a node NRS responsive to the bias voltage VGB. The voltage sensing stage 604 includes an NMOS device M3 and a resistive device 628. A drain and a gate of the NMOS device M3 are both coupled to the node NTS and are thereby coupled to one another and configured to receive the bias voltage VGB. A source of the NMOS device M3 is coupled to the node NRS. The resistive device 628 is coupled between the node NRS and the power reference node. The resistive device 628 has a resistance Rref/n and the NMOS device M3 has a channel size n*X, n being a positive number greater than or equal to one.

The NMOS device M3 and the resistive device 628 are thereby arranged as a voltage divider configured to, in operation, generate the voltage Vs on the node NRS by dividing the bias voltage VGB on the node NTS. The voltage Vs has a voltage level based on a ratio of a voltage Vgs (not labeled) of the NMOS device M3 and a voltage across the resistive device 628. A value of the ratio is based on the channel size n*X and the resistance Rref/n and is thereby substantially constant for varying values of the number n. As the number n increases, a response time of the voltage sensing stage 604 decreases and a standby current increases.

In some embodiments, the number n has a value ranging from one to eight. In some embodiments, the number n has a value ranging from two to six, e.g., four. Other values/ranges of the number n are within the scope of the present disclosure.

The gain stage 606 is configured to amplify an offset between the reference voltage VGB_ref and the bias voltage VGB based on the voltage Vs received on a node NSS coupled to node NRS of the voltage sensing stage 604. The gain stage 606 includes a current source 630, an NMOS device M2, and a resistive device 632. An anode of the current source 630 is configured to receive the power source voltage VDD and a cathode of the current source 630 is coupled to a node NDS. A drain of the NMOS device M2 is coupled to the node NDS, a source of the NMOS device M2 is coupled to the node NSS, and a gate of the NMOS device M2 is coupled to the gate of the NMOS device M1 of the reference stage 602. The resistive device 632 is coupled between the node NSS and the power reference node.

The current source 630 is configured to generate a current 634 having a current level m*Iref, the resistive device 632 has a resistance Rref/m and the NMOS device M2 has a channel size m*X, m being a positive number greater than or equal to one.

The gain stage 606 is thereby arranged as a common gate amplifier configured to, in operation, generate a bias voltage Vb on the node NDS responsive to the reference voltage VGB_ref received at the gate of the NMOS device M2 and the voltage Vs received on the node NSS. A gain of the gain stage 606 is thereby configured to have a value that is substantially constant for varying values of the number m. As the number m increases, a response time of the gain stage 606 decreases and a standby current increases.

In some embodiments, the number m has a value ranging from one to eight. In some embodiments, the number m has a value ranging from two to six, e.g., four. Other values/ranges of the number m are within the scope of the present disclosure.

The buffer 608 is configured to generate the bias voltage VGB on the node NTS based on the bias voltage Vb received on the node NDS. In this embodiment, the buffer 608 includes a PMOS device Mp. The PMOS device Mp has a drain configured to receive the power source voltage VDD, a gate coupled to the node NDS, and a source coupled to the node NTS.

The buffer 608 is thereby arranged as a common source amplifier configured to, in operation, generate the bias voltage VGB on the node NTS having a voltage level controlled by the relative voltage levels of the reference voltage VGB_ref generated by the reference stage 602 and the bias voltage Vb generated by the gain stage 606 responsive to the voltage Vs generated by the voltage sensing stage 604.

The memory circuit 600 thereby includes the reference stage 602, the voltage sensing stage 604, the gain stage 606, and the buffer 608 having a feedback arrangement configured to generate the bias voltage VGB. A total current used to generate the bias voltage VGB is the sum of the current 624 generated by current source 620, the current 634 generated by current source 630, and the current Ivgb controlled by the PMOS device Mp.

In both the standby and active states, the current 624 has the predetermined current level Iref and the current 634 has the predetermined current level m*Iref. In the standby state, the current Ivgb has a current level controlled by the voltage level of the bias voltage VGB and the configuration of the PMOS device Mp and the resistive device 628. In the active state, selection activity causes the current Ivgb to have one or more high transient current levels triggered by capacitive coupling to current paths 612 through voltage clamp devices 610. Based on the feedback arrangement of memory circuit 600, the PMOS device Mp is configured to supply the current Ivgb having a low current level in the standby state and having the one or more high current levels in the active state.

Compared to other approaches, memory circuit 600 is thereby capable of generating the bias voltage VGB using a decreased standby power and having an increased amount of charge able to be delivered dynamically such that power consumption is reduced and memory circuit speed is increased.

Figure 7:
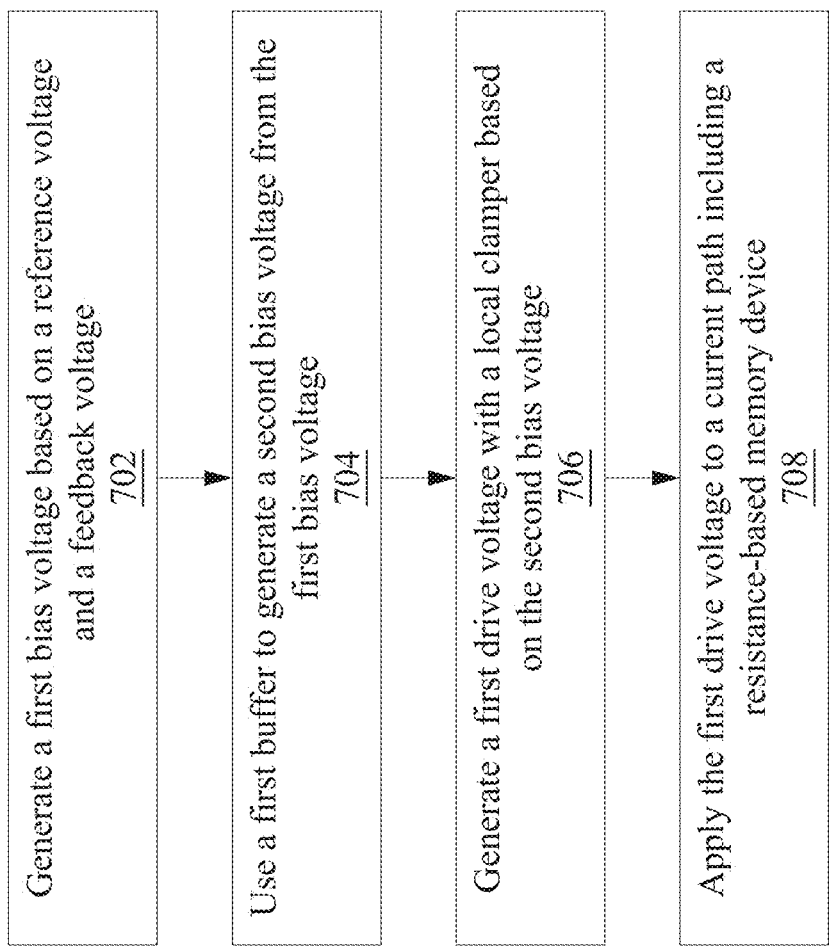
FIG. 7 is a flowchart of a method of performing a read operation, in accordance with some embodiments.

FIG. 7 is a flowchart of a method 700 of performing a read operation, in accordance with some embodiments. Method 700 is usable with a memory circuit, e.g., memory circuit 100 discussed above with respect to FIGS. 1A and 1B, memory circuit 100A discussed above with respect to FIG. 2, memory circuit 100B discussed above with respect to FIG. 4, memory circuit 100C discussed above with respect to FIG. 5, or memory circuit 600 discussed above with respect to FIG. 6.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7. In some embodiments, the operations of method 700 are a subset of operations of a method of operating a memory macro.

At operation 702, a first bias voltage is generated based on a reference voltage and a feedback voltage. In some embodiments, generating the first bias voltage based on the reference voltage and the feedback voltage includes generating the bias voltage VG based on the reference voltage Vref and the drive voltage VRBL as discussed above with respect to FIGS. 1A, 2, 4, and 5.

In some embodiments, generating the first bias voltage based on the feedback voltage includes using a first voltage clamp device to generate the feedback voltage based on the first bias voltage. In some embodiments, using the first voltage clamp device to generate the feedback voltage based on the first bias voltage includes using the voltage clamp device 120R to generate the drive voltage VRBL based on the bias voltage VG as discussed above with respect to FIGS. 2, 4, and 5.

In some embodiments, using the first voltage clamp device to generate the feedback voltage includes applying the feedback voltage to a replica circuit. In some embodiments, applying the feedback voltage to the replica circuit includes applying the drive voltage VRBL to the replica circuit 145A as discussed above with respect to FIGS. 2, 4, and 5.

In some embodiments, using the first voltage clamp device to generate the feedback voltage based on the first bias voltage includes using a first buffer to generate a second bias voltage received by the first voltage clamp device. In some embodiments, using the first buffer to generate the second bias voltage includes using buffer 141, 141A, or 141B to generate the bias voltage VGB' as discussed above with respect to FIGS. 1A, 2, 4, and 5.

In some embodiments, generating the first bias voltage based on the reference voltage and the feedback voltage includes generating the bias voltage Vb based on the reference voltage VGB_ref and the voltage Vs as discussed above with respect to FIG. 6.

In some embodiments, generating the first bias voltage based on the reference voltage and the feedback voltage includes generating the reference voltage based on a reference current. In some embodiments, generating the reference voltage based on the reference current includes generating the reference voltage VGB_ref based on the reference current Iref as discussed above with respect to FIG. 6.

In some embodiments, generating the reference voltage based on the reference current includes conducting the reference current with a replica resistive device. In some embodiments, conducting the reference current with the replica resistive device includes conducting the reference current Iref with resistive device 622 as discussed above with respect to FIG. 6.

At operation 704, a first buffer is used to generate a second bias voltage from the first bias voltage. In some embodiments, generating the second bias voltage includes generating the bias voltage VGB as discussed above with respect to FIGS. 1A-6.

In some embodiments, using the first buffer to generate the second bias voltage includes using a local buffer. In some embodiment, the local buffer is one local buffer of a plurality of local buffers, the second bias voltage is one second bias voltage of a plurality of second bias voltages, and using the first buffer to generate the second bias voltage includes using the plurality of local buffers to generate the plurality of second bias voltages.

In some embodiments, using the first buffer to generate the second bias voltage includes using one or more of the buffers 144, 144A, 144B, and/or 144C to generate one or more instances of the bias voltage VGB as discussed above with respect to FIGS. 1A, 2, 4, and 5.

In some embodiments, using the first buffer to generate the second bias voltage from the first bias voltage includes using a buffer included in the feedback configuration. In some embodiments, using the first buffer to generate the second bias voltage from the first bias voltage includes using the buffer 608 to generate the bias voltage VGB from the voltage Vs received by the gain stage 606 and used to generate the voltage Vb as discussed above with respect to FIG. 6.

At operation 706, a first drive voltage is generated with a local voltage clamp device based on the second bias voltage. In some embodiments, generating the first drive voltage with the local voltage clamp device based on the second bias voltage includes generating the drive voltage VD with the voltage clamp device 120 based on the bias voltage VGB as discussed above with respect to FIGS. 1A-2, 4, and 5.

In some embodiments, generating the first drive voltage with the local voltage clamp device based on the second bias voltage includes generating the drive voltage Vmtj with the voltage clamp device 610 based on the bias voltage VGB as discussed above with respect to FIG. 6.

At operation 708, the first drive voltage is applied to a current path including a resistance-based memory device. In some embodiments, applying the first drive voltage to the current path including the resistance-based memory device includes the current path including an RRAM device or an MTJ device.

In some embodiments, applying the first drive voltage to the current path including the resistance-based memory device includes applying the drive voltage VD to the current path 111 including the resistance-based memory device 150 as discussed above with respect to FIGS. 1A-2, 4, and 5.

In some embodiments, applying the first drive voltage to the current path including the resistance-based memory device includes applying the drive voltage Vmtj to the current path 612 including the resistance-based memory device 614 as discussed above with respect to FIG. 6.

By executing some or all of the operations of method 700, a bias voltage is provided to a voltage clamp device based on a feedback configuration of a memory circuit, thereby realizing the benefits discussed above with respect to memory circuits 100, 100A, 100B, 100C, and 600.

In some embodiments, a memory circuit includes a bias voltage generator including a first current path, a first voltage clamp device, and a first buffer. The bias voltage generator is configured to receive a reference voltage and generate a first bias voltage based on a voltage difference between the reference voltage and a first drive voltage, the first voltage clamp device is configured to generate the first drive voltage based on the first bias voltage by applying the first drive voltage to the first current path, and the first buffer is configured to receive the first bias voltage and generate a second bias voltage based on the first bias voltage. The memory circuit includes a second current path including a resistance-based memory device and a second voltage clamp device configured to generate a second drive voltage based on the second bias voltage and apply the second drive voltage to the second current path. In some embodiments, the bias voltage generator includes an operational amplifier having a non-inverting input terminal configured to receive the reference voltage, an inverting terminal configured to receive the first drive voltage, and an output terminal configured to output the first bias voltage. In some embodiments, the memory circuit further includes a second buffer configured to receive the first bias voltage and generate a third bias voltage based on the first bias voltage; a third current path having a second resistance-based memory device; and a third voltage clamp device configured to generate a third drive voltage based on the third bias voltage and apply the third drive voltage to the third current path. In some embodiments, the bias voltage generator includes a second buffer configured to generate a third bias voltage based on the first bias voltage, wherein the first voltage clamp device is configured to generate the first drive voltage based on the third bias voltage. In some embodiments, first buffer includes a first current source and a first NMOS device coupled to the first current source in a source follower configuration, wherein a gate of the first NMOS device is configured to receive the first bias voltage such that the second bias voltage is generated from a source of the first NMOS device; the first current source is configured to generate a first current, the first current source being configured to operate in a standby state and in an active state, wherein the first current source has a first current level in the active state and a second current level in the standby state, the first current level being of a higher magnitude than the second current level. In some embodiments, the second buffer includes a second current source and a second NMOS device coupled to the second current source in a source follower configuration, wherein a gate of the second NMOS device is configured to receive the first bias voltage such that the third bias voltage is generated from a source of the NMOS device, and the second current source is configured to generate a second current at approximately the second current level. In some embodiments, the resistance-based memory device includes an RRAM device. In some embodiments, the first buffer includes a first NMOS device having a gate configured to receive the first bias voltage, a second NMOS device configured to be deactivated in a standby state and activated in an active state, the second NMOS device having a gate configured to receive the first bias voltage, a first current source coupled to the first NMOS device in a source follower configuration, the first current source being configured to generate a first current having a first current level, a second current source configured to be deactivated in the standby state and activated in the active state, the second current source being configured to generate a second current at a second current level higher than the first current level, wherein the second voltage clamp device is coupled to a source of the first NMOS device and to a source of the second NMOS device so as to receive the second bias voltage. In some embodiments, the first buffer includes a first node configured to receive a supply voltage and a switch coupled in series between a drain of the second NMOS device and the first node, wherein the switch is configured to be open in the standby state and closed in the active state. In some embodiments, the first buffer includes a switch coupled between the second NMOS device and the first current source, wherein the switch is configured to be open in the standby state and closed in the active state. In some embodiments, the first buffer includes a first PMOS device having a gate configured to receive the first bias voltage, a second PMOS device configured to be deactivated in a standby state and activated in an active state, the second PMOS device having a gate configured to receive the first bias voltage, a first current source coupled to the first PMOS device in a source follower configuration, the first current source being configured to generate a first current having a first current level, a second current source configured to be deactivated in the standby state and activated in the active state, the second current source being configured to generate a second current at a second current level higher than the first current level, wherein the second voltage clamp device is coupled to a source of the first PMOS device and to a source of the second PMOS device so as to receive the second bias voltage. In some embodiments, the first buffer includes a first node configured to receive a supply voltage and a switch coupled in series between the second current source and the first node, wherein the switch is configured to be open in the standby state and closed in the active state. In some embodiments, the first buffer includes a switch coupled between the second PMOS device and a power reference node, wherein the switch is configured to be open in the standby state and closed in the active state.

In some embodiments, a memory circuit includes a first current path having a resistance-based memory device, a first voltage clamp device configured to generate a first drive voltage at the first current path, and a bias voltage generator including a first buffer and a replica circuit configured to mimic a resistance of at least a portion of the first current path having the resistance-based memory device. The bias voltage generator is configured to receive a reference voltage and generate a first bias voltage, the first buffer is configured to generate a second bias voltage based on the first bias voltage, the first replica circuit is configured to generate a second drive voltage based on the second bias voltage, and the bias voltage generator is configured to adjust the first bias voltage based on a voltage difference between the reference voltage and the second drive voltage. In some embodiments, the memory circuit includes a second buffer configured to receive the first bias voltage and generate a third bias voltage based on the first bias voltage, wherein the first voltage clamp device is configured to generate the first drive voltage based on the third bias voltage. In some embodiments, the memory circuit includes a sense amplifier, wherein the first voltage clamp device includes an NMOS device having a drain coupled to an input terminal of the sense amplifier and a source coupled to the first current path. In some embodiments, the bias voltage generator includes an operational amplifier having a non-inverting input terminal configured to receive the reference voltage, an inverting terminal configured to receive the first drive voltage, and an output terminal configured to output the first bias voltage, wherein the output terminal of the operational amplifier is coupled to a gate of an NMOS device of the first buffer. In some embodiments, the memory circuit includes a second current path having a second resistance-based memory device, a second voltage clamp device configured to generate a third drive voltage based on a fourth bias voltage, wherein the second voltage clamp device is configured to apply the third drive voltage to the second current path, and a third buffer configured to receive the first bias voltage and generate the fourth bias voltage based on the first bias voltage.

In some embodiments, a memory circuit includes a reference stage configured to generate a reference voltage, a voltage sensing stage configured to detect a voltage difference between the reference voltage and a first bias voltage, a gain stage configured to generate a second bias voltage based on the voltage difference, a buffer configured to generate the first bias voltage based on the second bias voltage, a first voltage clamp device configured to generate a first drive voltage based on the first bias voltage, and a first current path having a first resistance-based memory device, wherein the first voltage clamp device is configured to apply the first drive voltage to the first current path. In some embodiments, the memory circuit includes a second voltage clamp device configured to generate a second drive voltage based on the first bias voltage, and a second current path having a second resistance-based memory device, wherein the second voltage clamp device is configured to apply the second drive voltage to the second current path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a bias voltage generator comprising a first current path, a first voltage clamp device, and first and second buffers, wherein
      the bias voltage generator is configured to receive a reference voltage and generate a first bias voltage based on a voltage difference between the reference voltage and a first drive voltage,
      the first buffer is configured to receive the first bias voltage and generate a second bias voltage based on the first bias voltage,
      the second buffer is configured to generate a third bias voltage based on the first bias voltage, and
      the first voltage clamp device is configured to generate the first drive voltage based on the third bias voltage by applying the first drive voltage to the first current path;
   a second current path comprising a resistance-based memory device; and
   a second voltage clamp device configured to generate a second drive voltage based on the second bias voltage and apply the second drive voltage to the second current path.

2. The memory circuit of claim 1, wherein the bias voltage generator comprises an operational amplifier comprising a non-inverting input terminal configured to receive the reference voltage, an inverting terminal configured to receive the first drive voltage, and an output terminal configured to output the first bias voltage.

3. The memory circuit of claim 1, wherein the bias voltage generator further comprises:
   a third buffer configured to receive the first bias voltage and generate a fourth bias voltage based on the first bias voltage;

a third current path comprising a second resistance-based memory device; and a third voltage clamp device configured to generate a third drive voltage based on the fourth bias voltage and apply the third drive voltage to the third current path.

4. The memory circuit of claim 1, wherein the bias voltage generator comprises a capacitive device coupled to an input of the first buffer.

5. The memory circuit of claim 1, wherein
the first buffer comprises a first current source and a first NMOS device coupled to the first current source in a source follower configuration,
a gate of the first NMOS device is configured to receive the first bias voltage such that the second bias voltage is generated from a source of the first NMOS device, and
the first current source is configured to generate a first current, the first current source being configured to operate in a standby state and in an active state, wherein the first current source has a first current level in the active state and a second current level in the standby state, the first current level being of a higher magnitude than the second current level.

6. The memory circuit of claim 5, wherein
the second buffer comprises a second current source and a second NMOS device coupled to the second current source in a source follower configuration,
a gate of the second NMOS device is configured to receive the first bias voltage such that the third bias voltage is generated from a source of the second NMOS device, and
the second current source is configured to generate a second current at approximately the second current level.

7. The memory circuit of claim 1, wherein the resistance-based memory device comprises a resistive random-access memory (RRAM) device.

8. The memory circuit of claim 1, wherein the first buffer comprises:
a first NMOS device comprising a gate configured to receive the first bias voltage;
a second NMOS device configured to be deactivated in a standby state and activated in an active state, the second NMOS device comprising a gate configured to receive the first bias voltage;
a first current source coupled to the first NMOS device in a source follower configuration, the first current source being configured to generate a first current having a first current level; and
a second current source configured to be deactivated in the standby state and activated in the active state, the second current source being configured to generate a second current at a second current level higher than the first current level,
wherein the second voltage clamp device is coupled to a source of the first NMOS device and to a source of the second NMOS device so as to receive the second bias voltage.

9. The memory circuit of claim 8, wherein the first buffer comprises:
a first node configured to receive a supply voltage; and
a switch coupled in series between a drain of the second NMOS device and the first node, wherein the switch is configured to be open in the standby state and closed in the active state.

10. The memory circuit of claim 8, wherein the first buffer comprises a switch coupled between the second NMOS device and the second current source, wherein the switch is configured to be open in the standby state and closed in the active state.

11. The memory circuit of claim 1, wherein the first buffer comprises:
a first PMOS device comprising a gate configured to receive the first bias voltage;
a second PMOS device configured to be deactivated in a standby state and activated in an active state, the second PMOS device comprising a gate configured to receive the first bias voltage;
a first current source coupled to the first PMOS device in a source follower configuration, the first current source being configured to generate a first current having a first current level; and
a second current source configured to be deactivated in the standby state and activated in the active state, the second current source being configured to generate a second current at a second current level higher than the first current level,
wherein the second voltage clamp device is coupled to a source of the first PMOS device and to a source of the second PMOS device so as to receive the second bias voltage.

12. The memory circuit of claim 11, wherein the first buffer comprises:
a first node configured to receive a supply voltage; and
a switch coupled in series between the second current source and the first node, wherein the switch is configured to be open in the standby state and closed in the active state.

13. The memory circuit of claim 11, wherein the first buffer comprises a switch coupled between the second PMOS device and a power reference node, wherein the switch is configured to be open in the standby state and closed in the active state.

14. A memory circuit comprising:
a first current path comprising a first resistance-based memory device;
a first voltage clamp device configured to generate a first drive voltage at the first current path; and
a bias voltage generator comprising first and second buffers and a replica circuit configured to mimic a resistance of at least a portion of the first current path comprising the first resistance-based memory device,
wherein
the bias voltage generator is configured to receive a reference voltage and generate a first bias voltage,
the first buffer is configured to generate a second bias voltage based on the first bias voltage,
the second buffer is configured to receive the first bias voltage and generate a third bias voltage based on the first bias voltage,
the replica circuit is configured to generate a second drive voltage based on the second bias voltage,
the bias voltage generator is configured to adjust the first bias voltage based on a voltage difference between the reference voltage and the second drive voltage, and
the first voltage clamp device is configured to generate the first drive voltage based on the third bias voltage.

15. The memory circuit of claim 14, wherein each of the first and second buffers comprises an NMOS device coupled in series with a current source.

16. The memory circuit of claim 14, further comprising a sense amplifier, wherein the first voltage clamp device comprises an NMOS device comprising a drain coupled to an input terminal of the sense amplifier and a source coupled to the first current path.

17. The memory circuit of claim 14, wherein the bias voltage generator further comprises an operational amplifier comprising a non-inverting input terminal configured to receive the reference voltage, an inverting terminal configured to receive the first drive voltage, and an output terminal configured to output the first bias voltage, wherein the output terminal of the operational amplifier is coupled to a gate of an NMOS device of the first buffer.

18. The memory circuit of claim 14, further comprising:
a second current path having a second resistance-based memory device; and
a second voltage clamp device configured to generate a third drive voltage based on the third bias voltage, wherein the second voltage clamp device is configured to apply the third drive voltage to the second current path.

19. A memory circuit, comprising:
a reference stage configured to generate a reference voltage;
a voltage sensing stage configured to generate a sense voltage by detecting a voltage difference between the reference voltage and a first bias voltage;
a gain stage configured to generate a second bias voltage based on the sense voltage;
a buffer configured to generate the first bias voltage based on the second bias voltage;
a first voltage clamp device configured to generate a first drive voltage based on the first bias voltage; and
a first current path comprising a first resistance-based memory device, wherein the first voltage clamp device is configured to apply the first drive voltage to the first current path.

20. The memory circuit of claim 19, further comprising:
a second voltage clamp device configured to generate a second drive voltage based on the first bias voltage; and
a second current path comprising a second resistance-based memory device, wherein the second voltage clamp device is configured to apply the second drive voltage to the second current path.

* * * * *